US007494764B2

(12) United States Patent
Takahashi et al.

(10) Patent No.: US 7,494,764 B2
(45) Date of Patent: Feb. 24, 2009

(54) NEGATIVE PHOTOSENSITIVE RESIN COMPOSITION

(75) Inventors: Hideyuki Takahashi, Yokohama (JP); Kenji Ishizeki, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 11/121,203

(22) Filed: May 4, 2005

(65) Prior Publication Data

US 2005/0191580 A1 Sep. 1, 2005

Related U.S. Application Data

(63) Continuation of application No. PCT/JP03/14019, filed on Oct. 31, 2003.

(30) Foreign Application Priority Data

Nov. 6, 2002 (JP) ............................ 2002-322215

(51) Int. Cl.
*G03C 1/73* (2006.01)
*G03F 7/027* (2006.01)
*G03F 7/028* (2006.01)
*G03F 7/033* (2006.01)

(52) U.S. Cl. ................. 430/286.1; 430/287.1; 430/325; 430/907

(58) Field of Classification Search ....................... None
See application file for complete search history.

(56) References Cited

U.S. PATENT DOCUMENTS 6,007,961 A * 12/1999 Inomata et al. ............. 430/191
6,071,670 A * 6/2000 Ushirogouchi et al. ... 430/270.1
6,228,559 B1 * 5/2001 Oda ........................ 430/272.1
6,514,657 B1 * 2/2003 Sakurai et al. .............. 430/157
6,689,539 B2 2/2004 Kamiya et al. ........... 430/287.1
2005/0191580 A1 9/2005 Takahashi et al.

FOREIGN PATENT DOCUMENTS

| | | |
|---|---|---|
| JP | 4-39317 | 2/1992 |
| JP | 8-176504 | 7/1996 |
| JP | 10-142779 | 5/1998 |
| JP | 11-281815 | 10/1999 |
| JP | 2001-253928 | 9/2001 |
| JP | 2002-6491 | 1/2002 |

OTHER PUBLICATIONS

U.S. Appl. No. 12/127,993, filed May 28, 2008, Ishizeki et al.
U.S. Appl. No. 12/138,648, filed Jun. 31, 2008, Takahashi et al.

* cited by examiner

*Primary Examiner*—Sin J. Lee
(74) *Attorney, Agent, or Firm*—Oblon, Spivak, McClelland, Maier & Neustadt, P.C.

(57) ABSTRACT

A negative photosensitive resin composition comprising an alkali-soluble photosensitive resin (A) having acidic groups and having at least three ethylenic double bonds per molecule, an ink repellent (B) made of a polymer having polymerized units (b1) having a $C_{20}$ or lower alkyl group in which at least one of its hydrogen atoms is substituted by a fluorine atom (provided that the alkyl group may contain etheric oxygen), and polymerized units (b2) having an ethylenic double bond, and a photopolymerization initiator (C), wherein the fluorine content in the ink repellent (B) is from 5 to 25 mass %, and the proportion of the ink repellent (B) is from 0.01 to 20 mass %, based on the total solid content of the negative photosensitive resin composition. The negative photosensitive resin composition of the present invention is excellent in adhesion to a substrate, ink repellency and durability thereof and further excellent in alkali solubility and developability.

9 Claims, No Drawings

NEGATIVE PHOTOSENSITIVE RESIN COMPOSITION

TECHNICAL FIELD

The present invention relates to a negative photosensitive resin composition.

BACKGROUND ART

Heretofore, photosensitive resin compositions have been used to prepare masks for production of circuits, such as semiconductor integrated circuits (IC) and thin film transistor (TFT) circuits for liquid crystal displays (LCD), and a photosensitive resin composition capable of forming a finner pattern structure, is required.

On the other hand, a photosensitive resin composition has attracted attention also as a resist material to form ITO electrodes for LCD, an organic EL display, etc., or as a permanent film-forming material for an interlayer insulation film, a circuit-protecting film, a barrier rib material for a color filter, a barrier rib material for an organic EL display, etc. For example, in the production of a liquid crystal color filter, an ink jet method has been proposed wherein ink is applied by ink jet within fine pixels, and a photosensitive resin composition is formed into barrier ribs for the pixel pattern.

In such a case, the photosensitive resin composition to be formed into barrier ribs, is used as a permanent film-forming material and thus required to have adhesion to a substrate. Further, in order to prevent e.g. color mixing of inks between the adjacent pixel regions, it is required to have so-called ink repellency i.e. solvent repellency against the ink solvent such as water or xylene.

As such a photosensitive resin composition having ink repellency, a radiation-sensitive resin composition for forming barrier ribs for a color filter is, for example, disclosed which comprises hexafluoropropylene, an unsaturated carboxylic acid and/or an unsaturated carboxylic anhydride, and a fluorinated copolymer with an unsaturated compound copolymerizable with such a component, a photoacid generator, a crosslinkable compound, a fluorinated organic compound other than the above fluorinated copolymer, and an organic solvent. As the fluorinated organic compound, an oligomer containing perfluoroalkyl group and a lipophilic group, is exemplified (claim 1 in JP-A-11-281815).

Further, a negative resist composition for electron beam or X-ray is disclosed which comprises a compound to generate an acid and/or a radical species under irradiation with electron beam or X-ray, a resin insoluble in water and soluble in an aqueous alkaline solution, having at least one unsaturated bond polymerizable by an acid and/or radicals, a crosslinking agent to form crosslinkage with such a resin by an action of an acid, and a fluorine-type and/or silicon type surfactant (claim 1 in JP-A-2002-6491).

Further, a photosensitive resin composition is disclosed as a low dielectric constant resin composition, which comprises an unsaturated group-containing resin having a polybasic acid anhydride reacted as the case requires with a reaction product of a copolymer made of a monomer having fluorine atoms and an ethylenic double bond and a monomer having an epoxy group and an ethylenic double bond, with a compound having one ethylenic double bond and one carboxyl group per molecule, and a saturated monocarboxylic acid as an optional component, a diluting agent, and a photopolymerization initiator. An unsaturated group-containing resin is exemplified wherein a copolymer made of trifluoroethyl methacrylate and glycidyl methacrylate, is reacted with acrylic acid, and then reacted with succinic anhydride (claims 1 and 2 in JP-A-2001-253928).

Further, a covering agent is disclosed which comprises a hydrocarbon monomer containing at least one group selected from an acryloyl group, a methacryloyl group and a vinyl group per molecule, and a copolymer having acryloyl groups or methacryloyl groups, of a structure wherein an isocyanate group of an isocyanate group- and an acryloyl or methacryloyl group-containing monomer is addition-reacted to hydroxyl groups of a polymer obtained by reacting a $C_{3-20}$ perfluoroalkyl group-containing $\alpha,\beta$-unsaturated monomer, a polysiloxane chain-containing $\alpha,\beta$-unsaturated monomer, a no perfluoroalkyl group-containing and no polysiloxane chain-containing hydroxyl group-containing $\alpha,\beta$-unsaturated monomer, as essential components (claim 1 of JP-A-8-176504).

However, in the resin compositions disclosed in the above JP-A-11-281815 and JP-A-2002-6491, no ethylenic double bond is contained in the exemplified ink repellent component such as the fluorinated organic compound or the fluorine and/or silicone type surfactant. Accordingly, when such a fluorinated compound was applied to a radical-curable composition, curing of the ink repellent component tended to be inadequate, whereby the durability of the ink repellency tended to be inadequate.

Whereas, the unsaturated group-containing resin disclosed in JP-A-2001-253928 is intended to lower the dielectric constant, and with the exemplified compound, the ink repellency was inadequate. Further, in the photosensitive resin composition disclosed in JP-A-2001-253928, an alkali-soluble resin containing fluorine atoms was used, whereby the adhesion to the substrate was inadequate. Further, with such a photosensitive resin composition, the developability was inadequate, and it was difficult to form fine patterns.

Further, the hydrocarbon monomer in the covering agent disclosed in JP-A-8-176504 had a difficulty in providing a difference in the alkali solubility between an exposed portion and a non-exposed portion, whereby it was difficult to form fine patterns.

Accordingly, it is an object of the present invention to provide a negative photosensitive resin composition which is excellent in the adhesion to a substrate, the ink repellency and the durability thereof and which is further excellent in the developability.

DISCLOSURE OF THE INVENTION

The present invention provides a negative photosensitive resin composition comprising an alkali-soluble photosensitive resin (A) having acidic groups and having at least three ethylenic double bonds per molecule, an ink repellent (B) made of a polymer having polymerized units (b1) having a $C_{20}$ or lower alkyl group in which at least one of its hydrogen atoms is substituted by a fluorine atom (provided that the alkyl group may contain etheric oxygen) (hereinafter referred to as the present fluoroalkyl group), and polymerized units (b2) having an ethylenic double bond, and a photopolymerization initiator (C), wherein the fluorine content in the ink repellent (B) is from 5 to 25 mass %, and the proportion of the ink repellent (B) is from 0.01 to 20 mass %, based on the total solid content of the negative photosensitive resin composition.

With the photosensitive resin composition of the present invention, the present fluoroalkyl group in the ink repellent (B) imparts ink repellency. The present fluoroalkyl group has a surface migration characteristic, and at the time of prebaking, the ink repellent (B) will migrate to the vicinity of the surface of the coating film. Accordingly, even by an addition of a small amount of the ink repellent (B), adequate ink repellency can be imparted to the surface of the coating film at the time of prebaking.

Further, the ink repellent (B) has ethylenic double bonds and will be cured by irradiation with light. By this curing, the durability of the ink repellency will be high.

Further, at the time of the prebaking, the ink repellent (B) will migrate to the vicinity of the surface of the coating film, whereby the concentration of the ink repellent (B) in the vicinity of the substrate will relatively decrease, and a decrease in the adhesion to the substrate due to the present fluoroalkyl group, can be prevented.

Further, the ink repellency and the adhesion to a substrate are excellent when the fluorine content in the ink repellent (B) and the proportion of the ink repellent (B) in the total solid content of the negative photosensitive resin composition, are within the above-mentioned ranges.

The alkali-soluble photosensitive resin (A) has at least three ethylenic double bonds per molecule, whereby a difference in the alkali solubility between an exposed portion and a non-exposed portion can easily be made, the developability will be excellent, and it becomes possible to form fine patterns with less exposure.

The present invention preferably contains, based on 100 parts by mass of the photosensitive resin (A), from 0.1 to 200 parts by mass of the ink repellent (B) and from 0.1 to 50 parts by mass of the photopolymerization initiator (C). If the blend amount of the ink repellent (B) is within this range, the alkali solubility, the developability, the ink repellency and the adhesion to a substrate will be good.

Further, in the present invention, it is preferred that the ink repellent (B) has acidic groups. By this embodiment, the developability will be good, and it becomes possible to form finner patterns.

Further, the negative photosensitive resin composition of the present invention preferably contains, based on 100 parts by mass of the photosensitive resin (A), from 10 to 500 parts by mass of a radical crosslinking agent (D) made of an alkali-insoluble compound having at least two ethylenic double bonds. By this embodiment, curing by irradiation with light can be accelerated, and it becomes possible to carry out the curing in a shorter time.

Further, the negative photosensitive resin composition of the present invention preferably contains at least one member selected from the group consisting of carbon black, black titanium oxide, a black metal oxide pigment and an organic pigment. By this embodiment, a light-shielding property will be obtained, and the composition will be useful for a light-shielding coating film such as a black matrix.

BEST MODE FOR CARRYING OUT THE INVENTION

In the following specific compound names, “(meth)acrylate” means an acrylate or a methacrylate. Likewise, “(meth) acrylic acid” means acrylic acid or methacrylic acid, and “(meth)acrylamide” means acrylamide or methacrylamide.

Firstly, the photosensitive resin (A) of the present invention will be described. The photosensitive resin (A) has acidic groups and at least three ethylenic double bonds per molecule. However, the photosensitive resin (A) does not contain the present fluoroalkyl group.

As the acidic groups, at least one acidic group selected from the group consisting of a carboxyl group, a phenolic hydroxyl group and a sulfonic group, or its salt, is preferred.

As the ethylenic double bonds, addition polymerizable unsaturated groups such as an acrylic group, an allyl group, a vinyl group and a vinyl ether group, may, for example, be mentioned. Some or all of hydrogen atoms of such groups may be substituted by a hydrocarbon group. As such a hydrocarbon group, a methyl group is preferred.

The photosensitive resin (A) may, for example, be a radical polymer (A1) comprising polymerized units having an acidic group, polymerized units having an ethylenic double bond and other polymerized units, or a novolac resin (A2) having acidic groups and ethylenic double bonds in its molecule.

The radical polymer (A1) as one of the above preferred photosensitive resins (A) will be described. In the radical polymer (A1), the polymerized units having an acidic group are preferably introduced into the polymer by polymerizing a monomer having an acidic group. Otherwise, it is also a preferred method to introduce acidic groups to the polymer by a modifying method of reacting a suitable compound to a polymer having reactive sites.

The monomer having a carboxyl group may, for example, be acrylic acid, methacrylic acid, vinyl acetic acid, crotonic acid, itaconic acid, maleic acid, fumaric acid, cinnamic acid or salts thereof. They may be used alone or in combination as a mixture of two or more of them.

The monomer having a phenolic hydroxyl group may, for example, be o-hydroxystyrene, m-hydroxystyrene or p-hydroxystyrene. Further, it may be a compound having at least one hydrogen atom of such a benzene ring substituted by an alkyl group such as methyl, ethyl or n-butyl, an alkoxy group such as metonyms, ethoxy or n-butoxy, a halogen atom, a haloalkyl group having at least one hydrogen atom of the alkyl group substituted by a halogen atom, a nitro group, a cyano group or an amide group.

The monomer having a sulfonic group may, for example, be vinyl sulfonic acid, styrene sulfonic acid, (meth)allyl sulfonic acid, 2-hydroxy-3-(meth)allyloxypropane sulfonic acid, 2-sulfoethyl(meth)acrylate, 2-sulfopropyl(meth)acrylate, 2-hydroxy-3-(meth)acryloxypropane sulfonic acid, 2-(meth)acrylamide-2-methylpropane sulfonic acid or a salt thereof.

As the method for introducing carboxyl groups to the radical polymer (A1) by a various modification method of reacting a suitable compound to a polymer having reactive sites, there may, for example, be mentioned 1) a method of preliminarily copolymerizing a monomer having a hydroxyl group and then reacting an acid anhydride, or 2) a method of preliminarily copolymerizing an acid anhydride having an ethylenic double bond and then reacting a compound having a hydroxyl group.

Specific examples of the monomer having a hydroxyl group, include 2-hydroxyethyl(meth)acrylate, 2-hydroxypropyl(meth)acrylate, 3-hydroxypropyl(meth)acrylate, 4-hydroxybutyl(meth)acrylate, 5-hydroxypentyl(meth)acrylate, 6-hydroxyhexyl(meth)acrylate, 4-hydroxycyclohexyl (meth)acrylate, neopentyl glycol mono(meth)acrylate, 3-chloro-2-hydroxypropyl(meth)acrylate, glycerol mono (meth)acrylate, 2-hydroxyethyl vinyl ether, 4-hydroxybutyl vinyl ether, cyclohexanediol monovinyl ether, 2-hydroxyethyl allyl ether, N-hydroxymethyl(meth)acrylamide and N,N-bis(hydroxymethyl)(meth)acrylamide. These monomers may be used alone or in combination as a mixture of two or more of them.

Further, the monomer having a hydroxyl group may be a monomer having a POA chain having a hydroxyl group at the terminal. In this specification, POA chain means a polyoxyalkylene chain. It may, for example, be $CH_2{=}CHOCH_2C_6H_{10}CH_2O(C_2H_4O)_kH$ (wherein k is an integer of from 1 to 100, and the same applies hereinafter), $CH_2{=}CHOC_4H_8O(C_2H_4O)_kH$, $CH_2{=}CHCOOC_2H_4O(C_2H_4O)_kH$, $CH_2{=}C(CH_3)COOC_2H_4O(C_2H_4O)_kH$, $CH_2{=}CHCOOC_2H_4O(C_2H_4O)_m(C_3H_6O)_nH$ (wherein m is 0 or an integer of from 1 to 100, n is an integer of from 1 to 100, and m+n is from 1 to 100, and the same applies hereinafter) or $CH_2{=}C(CH_3)COOC_2H_4O(C_2H_4O)_m(C_3H_6O)_nH$. These monomers may be used alone or in combination as a mixture of two or more of them.

As the acid anhydride, an acid anhydride of a compound having at least two carboxyl groups per molecule, may be mentioned. For example, pivalic anhydride or trimellitic anhydride may be mentioned. Further, an acid anhydride having an ethylenic double bond may be mentioned, such as maleic anhydride, itaconic anhydride, citraconic anhydride, phthalic anhydride, 3-methyl phthalic anhydride, methyl-5-norbornene-2,3-dicarboxylic anhydride, 3,4,5,6-tetrahydrophthalic anhydride, cis-1,2,3,6-tetrahydrophthalic anhydride, or 2-buten-1-yl-succinic anhydride. These anhydrides may be used alone or in combination as a mixture of two or more of them.

The compound having a hydroxyl group may be a compound having at least one hydroxyl group. The above-mentioned specific examples of the monomer having a hydroxyl group, an alcohol such as ethanol, 1-propanol, 2-propanol, 1-butanol or ethylene glycol, a cellosolve such as 2-methoxyethanol, 2-ethoxyethanol or 2-butoxyethanol, or a carbitol such as 2-(2-methoxyethoxy)ethanol, 2-(2-ethoxyethoxy) ethanol or 2-(2-butoxyethoxy)ethanol, may, for example, be mentioned. Among them, a compound having one hydroxyl group per molecule is preferred. These compounds may be used alone or in combination as a mixture of two or more of them.

With the radical polymer (A1), the acid value is preferably from 10 to 400 (mgKOH/g), more preferably from 50 to 300 (mgKOH/g). Within such a range, the alkali solubility and the developability will be good.

In the radical polymer (A1), the polymerized units having an ethylenic double bond, may be preferably introduced to the polymer by a various modification method of reacting a suitable compound to a polymer having reactive sites. As such a modifying method, the following methods may, for example, be mentioned. 1) A method of preliminarily copolymerizing a monomer having a hydroxyl group and then reacting an acid anhydride having an ethylenic double bond, 2) a method of preliminarily copolymerizing a monomer having a hydroxyl group and then reacting a monomer having an isocyanate group, 3) a method of preliminarily copolymerizing a monomer having a hydroxyl group and then reacting a monomer having a chlorinated acyl group, 4) a method of preliminarily copolymerizing an acid anhydride having an ethylenic double bond, and then reacting a monomer having a hydroxyl group, 5) a method of preliminarily copolymerizing a monomer having a carboxyl group, and reacting a part thereof with a monomer having an epoxy group, and 6) a method of preliminarily copolymerizing a monomer having an epoxy group and then reacting a monomer having a carboxyl group.

As the monomer having a hydroxyl group, the above-mentioned specific examples may be mentioned. As specific examples of the acid anhydride having an ethylenic double bond, the above-mentioned specific examples may be mentioned. As a specific example of the monomer having an isocyanate group, 2-(meth)acryloyloxyethyl isocyanate may be mentioned. As a specific example of the monomer having an acyl chloride group, (meth)acryloyl chloride may be mentioned. As a specific example of the monomer having a carboxyl group, the above-mentioned specific example may be mentioned. As a specific example of the monomer having an epoxy group, glycidyl(meth)acrylate or 3,4-epoxycyclohexylmethyl acrylate may be mentioned.

The radical polymer (A1) has at least 3 ethylenic double bonds per molecule, whereby the difference in the alkali solubility between an exposed portion and a non-exposed portion can easily be obtained, and it becomes possible to form fine patterns with less exposure. The number of ethylenic double bonds per molecule is preferably at least 6.

The radical polymer (A1) in the present specification may have polymerized units having an acidic group and polymerized units other than the polymerized units having an ethylenic double bond (hereinafter referred to as other polymerized units). Such other polymerized units are preferably introduced to the polymer by polymerizing a monomer to give such other polymerized units. Otherwise, it is also a preferred method to introduce other polymerized units to the polymer by a various modification method of reacting a suitable compound to a polymer having reactive sites. An example of the polymerizable monomer to give such other polymerized units will be described.

The monomer to give such other polymerized units may, for example, be a hydrocarbon type olefin, a vinyl ether, an isopropenyl ether, an allyl ether, a vinyl ester, an allyl ester, a (meth)acrylate, a (meth)acrylamide, an aromatic vinyl compound, a chloroolefin or a conjugated diene. Such a compound may contain a functional group such as a hydroxyl group, a carbonyl group or an alkoxy group. However, such a compound does not contain an acidic group and/or an ethylenic double bond. Such compounds may be used alone or in combination as a mixture of two or more of them. Particularly preferred is a (meth)acrylate or a (meth)acrylamide, since it presents a polymer excellent in heat resistance.

Specific examples of the (meth)acrylate include methyl (meth)acrylate, ethyl(meth)acrylate, n-propyl(meth)acrylate, isopropyl(meth)acrylate, n-butyl(meth)acrylate, isobutyl (meth)acrylate, sec-butyl(meth)acrylate, t-butyl(meth)acrylate, n-pentyl(meth)acrylate, 3-methylbutyl(meth)acrylate, n-hexyl(meth)acrylate, 2-ethyl-n-hexyl(meth)acrylate, n-octyl(meth)acrylate, cyclohexyl(meth)acrylate, isobornyl (meth)acrylate, 2-hydroxyethyl(meth)acrylate, 2-hydroxypropyl(meth)acrylate, 3-hydroxypropyl(meth)acrylate, 4-hydroxybutyl(meth)acrylate, 5-hydroxypentyl(meth)acrylate, 6-hydroxyhexyl(meth)acrylate, 4-hydroxycyclohexyl (meth)acrylate, neopentyl glycol mono(meth)acrylate, 3-chloro-2-hydroxypropyl(meth)acrylate, glycerolmono (meth)acrylate, (1,1-dimethyl-3-oxobutyl)(meth)acrylate, 2-acetoacetoxyethyl(meth)acrylate, 2-methoxyethyl(meth) acrylate and 2-ethoxyethyl(meth)acrylate.

Specific examples of the (meth)acrylamide include (meth) acrylamide, N-vinylacetamide, N-vinylformamide, N-hydroxymethyl(meth)acrylamide, N,N-bis(hydroxymethyl) (meth)acrylamide, N-(1,1-dimethyl-3-oxobutyl)(meth) acrylamide, N-methoxymethyl(meth)acrylamide and N,N-bis(methoxymethyl)(meth)acrylamide.

In the radical polymer (A1), the proportion of other polymerized units is preferably at most 70 mass %, more preferably at most 50 mass %.

Within such a range, the alkali solubility and the developability will be good.

The number average molecular weight of the above radical polymer (A1) in the present invention is preferably at least 500 and less than 20,000, more preferably at least 2,000 and less than 15,000. In such a range, the alkali solubility and developability will be good.

The radical polymer (A1) may be prepared, for example, by the following method. Namely, it is a method wherein the polymerizable monomer is dissolved in a solvent and heated, and a polymerization initiator is added and reacted thereto. In such a reaction, a chain transfer agent may preferably be present, as the case requires. The polymerizable monomer, the polymerization initiator, the solvent and the chain transfer agent may be added continuously.

The solvent in the above method may, for example, be an alcohol such as ethanol, 1-propanol, 2-propanol, 1-butanol or ethylene glycol, a ketone such as acetone, methyl isobutyl ketone or cyclohexanone, a cellosolve such as 2-methoxyethanol, 2-ethoxyethanol or 2-butoxyethanol, a carbitol such as 2-(2-methoxyethoxy)ethanol, 2-(2-ethoxyethoxy)ethanol or 2-(2-butoxyethoxy)ethanol, an ester such as methyl acetate, ethyl acetate, n-butyl acetate, ethyl lactate, n-butyl lactate, ethylene glycol monomethyl ether acetate, propylene glycol monomethyl ether acetate, ethylene glycol diacetate or glycerol triacetate, diethylene glycol dimethyl ether, or diethylene glycol methyl ethyl ether. These solvents may be used alone or in combination as a mixture of two or more of them.

The polymerization initiator may, for example, be a known organic peroxide, an inorganic peroxide, or an azo compound. The organic peroxide and the inorganic peroxide may be used in the form of a redox catalyst in combination with a reducing agent. These polymerization initiators may be used alone or in combination as a mixture of two or more of them.

The organic peroxide may, for example, be benzoyl peroxide, lauroyl peroxide, isobutyryl peroxide, t-butyl hydroperoxide or t-butyl-α-cumyl peroxide.

The inorganic peroxide may, for example, be ammonium persulfate, sodium persulfate, potassium persulfate, hydrogen peroxide or a percarbonate.

The azo compound may, for example, be 2,2'-azobisisobutylonitrile, 1,1'-azobis(cyclohexane-1-carbonitrile), 2,2'-azobis(2,4-dimethylvaleronitrile), 2,2'-azobis(4-methoxy-2,4-dimethylvaleronitrile), dimethyl 2,2'-azobisisobutyrate or 2,2'-azobis(2-amidinopropane) dihydrochloride.

The chain transfer agent may, for example, be a mercaptan or an alkyl halide.

The mercaptan may, for example, be n-butylmercaptan, n-dodecylmercaptan, t-butylmercaptan, ethyl thioglycolate, 2-ethylhexyl thioglycolate or 2-mercaptoethanol.

The alkyl halide may, for example, be chloroform, carbon tetrachloride or carbon tetrabromide. These chain transfer agents may be used alone or in combination as a mixture of two or more of them.

Further, in a case where acidic groups and/or ethylenic double bonds are to be introduced to the polymer by a various modification method of reacting a suitable compound to a polymer having reactive sites, as the solvent to be used for the reaction, a solvent exemplified in the description of the solvent to be used for the preparation of the above copolymer, may be mentioned.

Further, it is preferred to incorporate a polymerization inhibitor. As such a polymerization inhibitor, a conventional polymerization inhibitor may be used. Specifically, 2,6-di-t-butyl-p-cresol may be mentioned.

Further, a catalyst or a neutralizing agent may be added. For example, in a case where a monomer having an isocyanate group is reacted to polymerized units having a hydroxyl group, a tin compound may, for example be used. Such a tin compound may, for example, be dibutyltin dilaurate, dibutyltin di(maleic acid monoester), dioctyltin dilaurate, dioctyltin di(maleic acid monoester) or dibutyltin diacetate. They may be used alone or in combination as a mixture of two or more of them.

In a case where a monomer having an acyl chloride group is reacted to polymerized units having a hydroxyl group, a basic catalyst may be used. As such a basic catalyst, triethylamine, pyridine, dimethylaniline or tetramethylurea may, for example, be mentioned. They may be used alone or in combination as a mixture of two or more of them.

Now, a novolac resin (A2) as one of the preferred photosensitive resins (A), will be described.

The above-mentioned novolac resin (A2) in the present invention is one obtained by polycondensation of a phenol with an aldehyde. Specific examples of the phenol include phenol, o-cresol, m-cresol, p-cresol, 2,3-xylenol, 2,5-xylenol, 3,5-xylenol, 2,3,5-trimethylphenol, catechol, resorcinol, hydroquinone, methylhydroquinone, pyrogallol and fluoroglycinol. As the aldehyde, formaldehyde is preferred.

Such a novolac resin (A2) may, for example, be a phenol/formaldehyde resin, a cresol/formaldehyde resin, a phenol/cresol/formaldehyde co-condensation resin.

The method for introducing ethylenic double bonds to the above resin may, for example, be a method of reacting a part of phenolic hydroxyl groups with a monomer having an epoxy group. Further, a method may be mentioned wherein a part or all of phenolic hydroxyl groups are reacted with epichlorohydrin to introduce epoxy groups to a novolac resin, and then such epoxy groups are reacted with a monomer having a carboxyl group. Further, an acid anhydride may be reacted to the hydroxyl groups formed by this reaction to introduce carboxyl groups into the molecule. Particularly when a cresol/formaldehyde resin type photosensitive resin is used as the photosensitive resin (A), the wettability with an ink on the substrate surface having the resin removed by development will be good, such being preferred.

As commercial products of the novolac resin containing the above-mentioned acidic groups and ethylenic double bonds, KAYARAD PCR-1069, K-48C, CCR-1105, CCR-1115, TCR-1025, TCR-1064, TCR-1286, ZFR-1122, ZFR-1124 and ZFR-1185 (all manufactured by Nippon Kayaku Co., Ltd.) may, for example, be mentioned.

The acid value of the novolac resin (A2) is preferably from 10 to 400 (mgKOH/g), more preferably from 50 to 300 (mgKOH/g). Within such a range, the alkali solubility and developability will be good.

The novolac resin (A2) has at least three ethylenic double bonds per molecule, whereby the difference in the alkali solubility between an exposed portion and a non-exposed portion can easily be obtained, and it becomes possible to form fine patterns with less exposure. The number of ethylenic double bonds per molecule is preferably at least 6.

Further, the number average molecular weight of the novolac resin (A2) is preferably at least 500 and less than 20,000, more preferably at least 2,000 and less than 15,000. Within such a range, the alkali solubility and developability will be good.

Now, the ink repellent (B) in the present invention will be described. The ink repellent (B) is a polymer having polymerized units (b1) having a $C_{20}$ or lower alkyl group in which at least one of its hydrogen atoms is substituted by a fluorine atom (provided that the alkyl group may contain etheric oxygen, which may hereinafter be referred to also as the present fluoroalkyl group), and polymerized units (b2) having an ethylenic double bond.

The present fluoroalkyl group may be linear or branched. Specific examples of the present fluoroalkyl group include $CF_3$, $CF_2CF_3$, $CF_2CHF_2$, $(CF_2)_2CF_3$, $(CF_2)_3CF_3$, $(CF_2)_4CF_3$, $(CF_2)_5CF_3$, $(CF_2)_6CF_3$, $(CF_2)_7CF_3$, $(CF_2)_8CF_3$, $(CF_2)_9CF_3$, $(CF_2)_{11}CF_3$ and $(CF_2)_{15}CF_3$.

Further, as specific examples in a case where the present fluoroalkyl group has an etheric oxygen atom, the following structures may be mentioned.

$CF(CF_3)O(CF_2)_5CF_3$,
$CF_2O(CF_2CF_2O)_pCF_3$ (p is from 1 to 8),
$CF(CF_3)O(CF_2CF(CF_3)O)_qC_6F_{13}$ (q is from 1 to 4),
$CF(CF_3)O(CF_2CF(CF_3)O)_rC_3F_7$ (r is from 1 to 5).

The present fluoroalkyl group is preferably a perfluoroalkyl group, whereby the ink repellency will be good. Further, the carbon number of the present fluoroalkyl group is preferably from 4 to 15, whereby the ink repellency will be excellent, and the compatibility of the polymerizable monomer having the present fluoroalkyl group with other polymerizable monomers will be good.

The polymerized units (b1) having the present fluoroalkyl group are preferably introduced to the polymer by polymerizing a polymerizable monomer having the present fluoroalkyl group. Otherwise, it is also a preferred method to introduce the present fluoroalkyl groups to the polymer by a various modification method of reacting a suitable compound to a polymer having reactive sites. Now, the polymerizable monomer to give polymerized units (b1) having the present fluoroalkyl group, will be described.

The monomer having the present fluoroalkyl group may, for example, be $CH_2{=}CR^4COOR^5R^f$, $CH_2{=}CR^4COOR^6NR^4SO_2R^f$, $CH_2{=}CR^4COOR^6NR^4COR^f$, $CH_2{=}CR^4COOCH_2CH(OH)R^5R^f$ or $CH_2{=}CR^4CR^4{=}CFR^f$. Here, $R^f$ represents the present fluoroalkyl group, $R^4$ represents a hydrogen atom or a methyl group, $R^5$ represents a single bond or a $C_{1-6}$ bivalent organic group, and $R^6$ represents a $C_{1-6}$ bivalent organic group.

Specific examples of $R^5$ or $R^6$ include $CH_2$, $CH_2CH_2$, $CH(CH_3)$, $CH_2CH_2CH_2$, $C(CH_3)_2$, $CH(CH_2CH_3)$, $CH_2CH_2CH_2CH_2$, $CH(CH_2CH_2CH_3)$, $CH_2(CH_2)_3CH_2$ and $CH(CH_2CH(CH_3)_2)$. Further, in the present invention, $R^5$ may be a single bond.

Further, the above polymerizable monomers may be used alone or in combination as a mixture of two or more of them.

The fluorine content in the ink repellent (B) is from 5 to 25 mass %, preferably from 12 to 20 mass %. The present fluoroalkyl group in the ink repellent is poor in compatibility with other components in the negative photosensitive resin composition, whereby the appearance of the coating film or barrier ribs obtained via a photolithography step may sometimes be impaired. When the fluorine content in the ink repellent (B) is within the above range, the compatibility with other components in the negative photosensitive resin composition in the present invention will be good, and the appearance of the coating film and the adhesion to a substrate will be good. Further, the ink repellency will be good.

In the ink repellent (B), the polymerized units (b2) having an ethylenic double bond, may be introduced to the polymer by a method similar to the method for introducing polymerized units having an ethylenic double bond in the above-mentioned radical polymer (A1). Further, the polymerized units (b2) do not contain the present fluoroalkyl group.

The ink repellent (B) preferably has from 3 to 100, more preferably from 6 to 30, ethylenic double bonds per molecule. Within such a range, the developability will be good.

In the present invention, the ink repellent (B) preferably has acidic groups, whereby the developability will be good, and it becomes possible to form finner patterns.

As such acidic groups, at least one acidic group selected from the group consisting of a carboxyl group, a phenolic hydroxyl group and a sulfonic group, or its salt, is preferred.

As a method for introducing acidic groups to the ink repellent (B), it is preferred to introduce them to the polymer, for example, by polymerizing a monomer having an acidic group. Otherwise, it is also a preferred method to introduce acidic groups to the polymer by a various modification method of reacting a suitable compound to a polymer having reactive sites.

The monomer having a carboxyl group, the monomer having a phenolic hydroxyl group and the monomer having a sulfonic group may be such monomers as described with respect to the above-described radical polymer (A1).

The method for introducing carboxyl groups to the polymer by a various modification method of reacting a suitable compound to a polymer having reactive sites, may, for example, be 1) a method of preliminarily copolymerizing a monomer having a hydroxyl group and then reacting an acid anhydride, or 2) a method of preliminarily copolymerizing an acid anhydride having an ethylenic double bond and then reacting a compound having a hydroxyl group.

As the monomer having a hydroxyl group, the acid anhydride, the acid anhydride having an ethylenic double bond and the compound having a hydroxyl group, specific examples disclosed in the description of the radical polymer (A1) may be mentioned.

The acid value of the ink repellent (B) is preferably from 10 to 400 (mgKOH/g), more preferably from 20 to 300 (mgKOH/g). Within such a range, the alkali solubility and the developability will be good.

In the present invention, the ink repellent (B) may have polymerized units (b4) other than the polymerized units (b1) having the present fluoroalkyl group, the polymerized units (b2) having an ethylenic double bond and the polymerized units (b3) having an acidic group.

The polymerized units (b4) may be introduced to the polymer preferably by polymerizing a monomer. Otherwise, it is also a preferred method to introduce them to the polymer by a various modification method of reacting a suitable compound to a polymer having reactive sites. Now, the polymerizable monomer to give the polymerized units (b4) will be described with reference to some examples.

The monomer to give the polymerized units (b4) may, for example, be a hydrocarbon olefin, a vinyl ether, an isopropenyl ether, an allyl ether, a vinylester, an allylester, a (meth) acrylate, a (meth)acrylamide, an aromatic vinyl compound, a chloroolefin or a conjugated diene. Such a compound may contain a functional group, and such a functional group may, for example, be a hydroxyl group, a carbonyl group or an alkoxy group.

The above monomers may be used alone or in combination as a mixture of two or more of them. Particularly preferred is a (meth)acrylate or a (meth)acrylamide. As the (meth)acrylate and the (meth)acrylamide, specific examples disclosed in the description of the radical polymer (A1) may be mentioned.

Further, in the ink repellent (B), the proportion of the polymerized units (b4) is preferably at most 70 mass %, more preferably at most 50 mass %. Within such a range, the alkali solubility and developability will be good.

The ink repellent (B) may be prepared by a method similar to the one described with respect to the radical polymer (A1).

The number average molecular weight of the ink repellent (B) is preferably at least 500 and less than 15,000, more preferably at least 1,000 and less than 10,000. Within such a range, the alkali solubility and developability will be good.

The proportion of the ink repellent (B) is from 0.01 to 20 mass %, based on the total solid content of the negative photosensitive resin composition. If the proportion of the ink repellent (B) is within this range, the compatibility with other components in the negative photosensitive resin composition will be good, and accordingly, the appearance of the coating film and the adhesion to a substrate will be good. Further, the ink repellency will be good. The proportion is preferably from 0.05 to 15 mass %.

Further, the blend amount of the ink repellent (B) is preferably from 0.1 to 200 parts by mass, more preferably from 0.5 to 100 parts by mass, based on 100 parts by mass of the alkali-soluble photosensitive resin (A). Within such a range, the alkali solubility, developability and ink repellency will be good, and it is possible to prevent deterioration of the adhesion to a substrate due to the present fluoroalkyl group.

Now, the photopolymerization initiator (C) will be described. The photopolymerization initiator (C) is not particularly limited, but a photo-radical generator is preferred.

The photo-radical generator may, for example, be an α-diketone such as benzyl, diacetyl, methylphenyl glyoxylate or 9,10-phenanthrenequinone, an acyloin such as benzoin, an acyloin ether such as benzoin methyl ether, benzoin ethyl ether or benzoin isopropyl ether, a thioxanthone such as thioxanthone, 2-chlorothioxanthone, 2-methylthioxanthone, 2,4-dimethylthioxanthone, isopropylthioxanthone, 2,4-diethylthioxanthone, 2,4-dichlorothioxanthone, 2,4-diisopropylthioxanthone or thioxanthone-4-sulfonic acid, a benzophenone such as benzophenone, 4,4'-bis(dimethylamino) benzophenone or 4,4'-bis(diethylamino)benzophenone, an acetophenone such as acetophenone, 2-(4-toluenesulfonyloxy)-2-phenylacetophenone, p-dimethylaminoacetophenone, 2,2'-dimethoxy-2-phenylacetophenone, p-methoxyacetophenone, 2-methyl[4-(methylthio)phenyl]-2-morpholino-1-propanone or 2-benzyl-2-dimethylamino-1-(4-morpholinophenyl)-butan-1-one, a quinone such as anthraquinone, 2-ethylanthraquinone, camphorquinone or 1,4-naphthoquinone, an aminobenzoate such as ethyl 2-dimethylaminobenzoate, ethyl 4-dimethylaminobenzoate, (n-butoxy)ethyl 4-dimethylaminobenzoate, isoamyl 4-dimethylaminobenzoate or 2-ethylhexyl 4-dimethylaminobenzoate, a halogen compound such as phenacyl chloride or trihalomethylphenylsulfone, or a peroxide such as acylphosphineoxide or di-t-butyl peroxide.

Especially, the above aminobenzoate and the above benzophenone may sometimes present a sensitizing effect when used in combination with another photo-radical generator. Further, an aliphatic amine such as triethanolamine, methyldiethanolamine, triisopropanolamine, n-butylamine, N-methyldiethanolamine or diethylaminoethyl methacrylate, may also sometimes exhibits a sensitizing effect when used in combination with a photo-radical generator.

Commercial products of the photopolymerization initiator (C) may, for example, be IRGACURE-184, 261, 369, 500, 651 and 907 (all manufactured by Ciba Geigy Company), Darocur-1173, 1116, 2959, 1664 and 4043 (all manufactured by Merck Japan Limited), KAYACURE-DETX, -MBP, -DMBI, -EPA and -OA (all manufactured by Nippon Kayaku Co., Ltd.), VICURE-10 and 55 (all manufactured by STAUFFER Co., LTD.), TRIGONALP1 (manufactured by AKZO Co., LTD.), SANDORAY 1000 (manufactured by SANDOZ Co., LTD.), DEAP (manufactured by APJOHN Co., LTD.) or QUANTACURE-PDO, -ITX and -EPD (manufactured by WARD BLEKINSOP Co., LTD.).

The above photopolymerization initiators (C) may be used alone or in combination as a mixture of two or more of them.

The blend amount of the photopolymerization initiator (C) is preferably from 0.1 to 50 parts by mass, more preferably from 0.5 to 30 parts by mass, based on 100 parts by mass of the photosensitive resin (A). Within such a range, the developability will be good.

In the present invention, a radical crosslinking agent (D) may also be incorporated, whereby curing by irradiation with light will be accelerated, and it becomes possible to carry out the curing in a relatively short time.

The radical crosslinking agent (D) is made of an alkali-insoluble compound having at least two ethylenic double bonds. However, it does not contain the present fluoroalkyl group.

Specific examples include diethylene glycol di(meth)acrylate, tetraethylene glycol di(meth)acrylate, tripropylene glycol di(meth)acrylate, neopentyl glycol di(meth)acrylate, 1,9-nonanediol di(meth)acrylate, trimethylolpropane tri(meth) acrylate, pentaerythritol tri(meth)acrylate, pentaerythritol tetra(meth)acrylate, ditrimethylolpropane tetra(meth)acrylate and dipentaerythritol hexa(meth)acrylate. They may be used alone or in combination as a mixture of two or more of them.

Commercial products of the radical crosslinking agent (D) may, for example, be Aronix M-309, M-400, M-405, M-450, M-7100, M-8030 and M-8060 (manufactured by TOAGOSEI CO., LTD.), KAYARAD DPHA, D-310, D-330, TMPTA, DPCA-20, DPCA-30, DPCA-60 and DPCA-120 (all manufactured by Nippon Kayaku Co., Ltd.), V-295, V-300, V-360, V-GPT, V-3PA and V-400 (manufactured by Osaka Organic Chemical Ind. Ltd.) or PPZ (manufactured by Idemitsu Petrochemical Co., Ltd.).

The blend amount of the radical crosslinking agent (D) is preferably from 10 to 500 parts by mass, more preferably from 50 to 200 parts by mass, based on 100 parts by mass of the alkali-soluble photosensitive resin (A). Within such a range, the developability will be good.

Further, in the negative photosensitive resin composition of the present invention, a silane coupling agent (E) may be used, as the case requires, whereby the adhesion to a substrate may be improved.

Specific examples of the silane coupling agent include tetraethoxysilane, 3-glycidoxypropyltrimethoxysilane, methyltrimethoxysilane, vinyltrimethoxysilane, 3-methacryloyloxypropyltrimethoxysilane, 3-chloropropyltrimethoxysilane, 3-mercaptopropyltrimethoxysilane, heptadecafluorooctylethyltrimethoxysilane and POA chain-containing triethoxysilane. They may be used alone or in combination as a mixture of two or more of them.

Further, in the negative photosensitive resin composition of the present invention, a diluting agent (F) may be used.

As specific examples of the diluting agent (F), the polymerizable monomers exemplified in the description of the radical polymer (A1) may be mentioned. Further, the solvents exemplified in the description of the solvent to be used at the time of preparing the radical polymer (A1), may be mentioned. Further, a chain hydrocarbon such as n-butane or n-hexane, a cyclic saturated hydrocarbon such as cyclohexane, or an aromatic hydrocarbon such as toluene, xylene or benzyl alcohol, may, for example, be mentioned. They may be used alone or in combination as a mixture of two or more of them.

Further, in the negative photosensitive resin composition of the present invention, a thermosetting agent (G) may be used as the case requires, whereby the heat resistance or water permeation resistance of the photosensitive resin may be improved.

The thermosetting agent (G) may, for example, be an amino resin, a compound having at least two epoxy groups, a compound having at least two hydrazino groups, a polycarbodiimide compound, a compound having at least two oxazoline groups, a compound having at least two aziridine groups, a polyvalent metal, a compound having at least two mercapto groups or a polyisocyanate compound. These compounds may be used alone or in combination as a mixture of two or more of them.

The amino resin may, for example, be a compound having some or all of amino groups of e.g. a melamine compound, a guanamine compound or a urea compound hydroxy methylated, or a compound having some or all of hydroxyl groups of such a hydroxy methylated compound etherified with e.g. methanol, ethanol, n-butyl alcohol or 2-methyl-1-propanol, such as hexamethoxymethylmelamine.

The compound having at least two epoxy groups may, for example, be a glycidyl ether such as a bisphenol A epoxy resin, a bisphenol F epoxy resin, a phenol/novolac epoxy resin, a cresol/novolac epoxy resin, a trisphenolmethane type epoxy resin or a brominated epoxy resin, an alicyclic epoxy resin such as 3,4-epoxycyclohexylmethyl-3,4-epoxycyclohexane carboxylate or bis(2,3-epoxycyclopentyl)ether, a glycidyl ester such as diglycidyl hexahydrophthalate, diglycidyl tetrahydrophthalate or diglycidyl phthalate, a glycidyl amine such as tetraglycidyl diaminodiphenylmethane or triglycidyl paraminophenol, or a heterocyclic epoxy resin such as triglycidyl isocyanurate.

The compound having at least two hydrazine groups may, for example, be carbohydrazide, oxalic dihydrazide, malonic dihydrazide, succinic dihydrazide, glutaric dihydrazide, adipic dihydrazide, heptanedioic dihydrazide, octandioic dihydrazide, nonanedioic dihydrazide, dodecanedioic dihydrazide, hexadecanedioic dihydrazide, phthalic dihydrazide, isophthalic dihydrazide, terephthalic dihydrazide, 1,4-naphthoeic dihydrazide, 2,6-naphthoeic dihydrazide, 4,4'-bisbenzene dihydrazide, 2,6-pyridine dihydrazide, 1,4-cyclohexane dihydrazide, tartaric dihydrazide, malic dihydrazide, iminodiacetic dihydrazide or itaconic dihydrazide. Ethylenediamine tetraacetic tetrahydrazide, citric trihydrazide, cyclohexanetricarboxylic trihydrazide, trimellitic trihydrazide, pyromellitic trihydrazide, pyromellitic tetrahydrazide or 1,4,5,8-naphthoeic tetrahydrazide may also be mentioned.

The polycarbodiimide compound may be obtained by a de-carbon dioxide condensation reaction of a known organic diisocyanate. At that time, a phosphate compound such as trimethyl phosphate or triethyl phosphate may be used as a known catalyst. Further, by using a mixture of an organic diisocyanate and a hydroxyl group-containing polyethylene glycol, a nonionic hydrophilic polycarbodiimide compound may be obtained.

The compound having at least two oxazoline groups may, for example, be a copolymer of a polymerizable monomer such as 2-vinyl-2-oxazoline, 2-vinyl-4-methyl-2-oxazoline, 2-vinyl-5-methyl-2-oxazoline, 2-isopropenyl-2-oxazoline or 2-isopropenyl-4-methyl-2-oxazoline.

The compound having at least two aziridine groups may, for example, be 2,2-bishydroxymethylbutanol-tris[3-(1-aziridinyl)propionate], or 2,2,2-trishydroxymethylethanol-tris[3-(1-aziridinyl)propionate].

The polyvalent metal may, for example, be zinc chloride, ammonium zinc chloride, zinc nitrate, zinc carbonate, zinc sulfate, chromic acid and its salt, bichromic acid and its salt, diisopropoxy titanium bisacetylacetone, aluminum sulfate, triacetyl aluminum, zirconyl nitrate, zirconyl acetate, ammonium zirconyl carbonate, potassium zirconium fluoride or ammonium zirconium fluoride.

The compound having at least two mercapto groups may, for example, be an aliphatic dimercapto compound or an aromatic dimercapto compound.

The aliphatic dimercapto compound may, for example, be an aliphatic dimercapto compound such as 1,6-dimercaptohexane, dimercapto diethyl ether, triglycol dimercaptan or bis(2-mercaptoethyl) sulfide.

The aromatic dimercapto compound may, for example, be 3,4-dimercapto toluene, bis(4-mercaptophenyl) sulfide, 2,5-dimercapto-1,3,4-thiadiazole, 4-t-butyl-1,2-benzenedithiol, 2-di-n-butylamino-4,6-dimercapto-1,3,5-triazine or 2,4,6-trimercapto-1,3,5-triazine.

The polyisocyanate compound may, for example, be a polyisocyanate compound such as hexamethylene diisocyanate or isophorone diisocyanate, a silylisocyanate compound such as methylsilyl triisocyanate, and/or condensates or oligomers thereof, or a blocked polyisocyanate compound having the isocyanate groups blocked with a blocking agent such as a phenol.

Among the above thermosetting agents (G), particularly preferred is an amino resin, a compound having at least two epoxy groups or a compound having at least two oxazoline groups, whereby the storage stability of the negative photosensitive resin composition will be good.

In the negative photosensitive resin composition of the present invention, a curing accelerator, a coloring agent, a thickner, a plasticizer, a defoaming agent, a leveling agent, a cissing preventive agent or an ultraviolet absorber, may, for example, be used, as the case requires. The coloring agent may, for example, be a dye, an organic pigment, an inorganic pigment or a metallic pigment.

The negative photosensitive resin composition having the coloring agent incorporated, may be used as a light-shielding coating film. For example, as a material for barrier ribs for a color filter, a negative photosensitive resin composition capable of forming a black coating film may be used in order to increase the contrast of the emitted color of RGB.

The coloring agent for black color is preferably carbon black, titanium black or a black metal oxide pigment. Further, a combination for black color is also preferred wherein at least two organic pigments selected from the group consisting of red, blue, green, purple, yellow, cyan, magenta, etc. are mixed.

The carbon black may, for example, be lamp black, acetylene black, thermal black, channel black or furnace black.

The titanium black is one obtained by oxidation of titanium or reduction of titanium dioxide, and is at least one member represented by $Ti_uO_{2u-1}$ (wherein u is a number of at least 1).

The black color metal oxide pigment may, for example, be an oxide of copper, iron, chromium, manganese or cobalt. A composite metal oxide made of at least two types selected from the above-mentioned metal oxides, is preferred. For example, an oxide of copper/chromium, an oxide of copper/chromium/manganese, an oxide of copper/iron/manganese, or an oxide of cobalt/iron/manganese, may, for example, be mentioned.

The blue pigment may, for example, be a phthalocyanine pigment; the red pigment may, for example, be a quinacridone pigment, a perylene pigment, a piroro-pyrrole pigment, or an anthraquinone pigment; the green pigment may, for example, be a halogenated phthalocyanine pigment; the purple pigment may, for example, be dioxadine violet, fast violet B, methyl violet lake or indanthrene brilliant violet; the yellow pigment may, for example, be a tetrachloroisoindolinone pigment, a hansa yellow pigment, a benzidine yellow pigment, or an azo pigment; the cyane pigment may, for example, be non-metallic phthalocyanine or merocyanine; and the magenta pigment may, for example, be dimethyl quinacridone or thioindigo.

The pigment may be dispersed together with a dispersant (such as a polycaprolacton compound or a long chain alkyl polyamino amide compound) by a dispersing machine such as a sand mill or a roll mill and then added to the photosensitive resin composition. The particle size is preferably at most 1 μm. Within such a range, the developability of the negative photosensitive resin composition will be good.

Now, a method for forming a pattern by using the above negative photosensitive resin composition will be described. Firstly, by a conventional method for forming a coating film, a coating film of the negative photosensitive resin composition is formed on the surface of a substrate. The method for forming a coating film may, for example, be a spray coating method, a roll coating method, a spin coating method or a bar coating method.

As the substrate, its material is not particularly limited, but it may, for example, be various types of glass sheets, a polyester such as polyethylene terephthalate, a polyolefin such as polypropylene or polyethylene, a thermoplastic sheet such as polymethyl methacrylate or polysulfone, or a thermosetting plastic sheet such as an epoxy resin, a polyester resin or a poly(meth)acrylic resin. Especially, from the viewpoint of the heat resistance, a glass sheet or heat resistant plastic is preferably employed.

Then, the coating film is dried (hereinafter referred to as prebaking). By the prebaking, the solvent will evaporate, whereby a coating film having no fluidity will be obtained. The conditions for the prebaking vary depending upon the types of the respective components, the blend proportions, etc., but preferably within wide ranges of from 60 to 120° C. for from 10 to 600 seconds.

Then, the heated coating film is irradiated with light via a mask having a prescribed pattern, followed by development with a developing solution to remove a non-exposed portion. The light to be irradiated may, for example, be visible light, ultraviolet rays, far ultraviolet rays, an excimer laser such as KrF excimer laser, ArF excimer laser, $F_2$ excimer laser, $Kr_2$ excimer laser, KrAr excimer laser or $Ar_2$ excimer laser, X-rays or electron rays. From the viewpoint of easy control of the reaction and economical efficiency, ultraviolet rays are preferred.

As the irradiation apparatus, a known super high pressure mercury lamp or the like may be employed. The exposure is usually carried out within a range of from 5 to 1,000 $mJ/cm^2$.

As the developing solution, an aqueous alkali solution may be used which is made of an alkali, such as an inorganic alkali such as sodium hydroxide, potassium hydroxide, sodium carbonate, sodium silicate, sodium methasilicate or aqueous ammonia; a primary amine such as ethylamine or n-propylamine; a secondary amine such as diethylamine or di-n-propylamine; a tertiary amine such as triethylamine, methyldiethylamine or N-methylpyrrolidone; an alcohol amine such as dimethylethanolamine or triethanolamine; a quaternary ammonium salt such as tetramethylammonium hydroxide, tetraethylammonium hydroxide or choline; or a cyclic amine such as pyrrole or piperidine. Further, an aqueous solution having a water-soluble organic solvent such as methanol or ethanol, a surfactant or the like, added in a suitable amount to the above aqueous alkali solution, may also be used as the developing solution.

The developing time is preferably from 30 to 180 seconds. Further, the developing method may be any method such as a dipping method or a liquid building method. After the development, washing with water is carried out, followed by drying with compressed air or compressed nitrogen to remove moisture on the substrate. Then, heat treatment is carried out preferably at a temperature of from 150 to 250° C. for from 5 to 90 minutes by a heating apparatus such as a hotplate or an oven, whereby a pattern will be formed.

Thus, the negative photosensitive resin composition of the present invention is alkali-soluble by itself and can be used as a negative resist whereby radicals will be generated from the photopolymerization initiator (C) under irradiation with light, and mainly the alkali-soluble photosensitive resin (A) and the ink repellent (B) will be crosslinked and cured, and portions not irradiated with light will be removed by alkali development.

And, the patterned coating film on the surface of a substrate is subjected to a washing step as a post treating step as mentioned above, in many cases. The coating film obtained from the negative photosensitive resin composition of the present invention maintains good ink repellency even after the washing step, whereby excellent ink repellency and its durability, the alkali solubility and the developability can be obtained. Further, it is excellent in the adhesion to the substrate.

The mechanism to provide such excellent ink repellency and its durability, the adhesion to the substrate and the developability, is not necessarily clearly understood, but may be explained as follows.

The present fluoroalkyl group in the ink repellent (B) imparts ink repellency, but such a fluoroalkyl group has a surface migration characteristic, whereby at the time of prebaking, the ink repellent (B) moves to the vicinity of the surface of the coating film. Accordingly, even by an addition of a small amount of the ink repellent (B), sufficient ink repellency can be imparted to the surface of the coating film at the time of the prebaking. Further, the ink repellent (B) has ethylenic double bonds and curable under irradiation with light, and it is considered that by this curing, the durability of the ink repellency will be high.

Further, by the migration of the ink repellent (B) to the vicinity of the surface of the coating film at the time of prebaking, the concentration of the ink repellent (B) in the vicinity of the substrate will relatively decrease, whereby it is possible to prevent deterioration of the adhesion to the substrate due to the present fluoroalkyl group.

Further, the photosensitive resin (A) primarily imparts the developability and has at least three ethylenic double bonds per molecule, whereby a difference in the alkali solubility between an exposed portion and a non-exposed portion can easily be obtained, and it becomes possible to form fine patterns with less exposure.

Further, the above ink repellency can be estimated by the contact angles of water and xylene. The contact angle of water is preferably at least 90°, more preferably at least 100°. Further, the contact angle of xylene is at least 30°, more preferably at least 40°.

Further, the negative photosensitive resin composition of the present invention has excellent alkali solubility and developability, whereby it is possible to form fine patterns. Specifically, it is preferably used to form a pattern of at most 100 μm, more preferably to form a pattern of at most 50 μm.

EXAMPLES

Now, the present invention will be described in detail with reference to Preparation Examples and Working Examples. However, it should be understood that the present invention is by no means restricted to such specific Examples. Examples 1 to 9, 16 and 17 are Examples of the present invention, and Examples 10 to 15 are Comparative Examples. Further, in the following, parts and % are based on "mass" unless otherwise specified. Further, the number average molecular weight is a value measured by a gel permeation chromatography method by using polystyrene as the standard substance.

Abbreviated symbols for compounds used in each Example are shown below.

C6FMA: $CH_2{=}C(CH_3)COOCH_2CH_2(CF_2)_6F$

C4FMA: $CH_2{=}C(CH_3)COOCH_2CH_2(CF_2)_4F$

C8FA: $CH_2{=}CHCOOCH_2CH_2(CF_2)_8F$

MAA: methacrylic acid

AA: acrylic acid

HEMA: 2-hydroxyethyl methacrylate

N-MAA: N-hydroxymethylacrylamide

MMA: methyl methacrylate

CHMA: cyclohexyl methacrylate

IBMA: isobornyl methacrylate

GMA: glycidyl methacrylate

TFEMA: trifluoroethyl methacrylate

DSH: n-dodecylmercaptan

V-70: 2,2'-azobis(4-methoxy-2,4-dimethylvaleronitrile) (tradename V-70, manufactured by Wako Pure Chemical Industries, Ltd.)

MOI: 2-methacryloyloxyethyl isocyanate

AC: acryloyl chloride

ECA: 3,4-epoxycyclohexylmethyl acrylate

DBTDL: dibutyltin dilaurate

BHT: 2,6-di-t-butyl-p-cresol

TEA: triethylamine

EEA: 2-(2-ethoxyethoxy)ethyl acetate

MIBK: methyl isobutyl ketone

IR907: photopolymerization initiator (IRGACURE-907, manufactured by Ciba Geigy Company)

D310: dipentaerythritol pentaacrylate (tradename KAYARAD D-310, manufactured by Nippon Kayaku Co., Ltd.)

DEAB: 4,4'-bis(diethylamino)benzophenone

KBM403: 3-glycidoxypropyltrimethoxysilane (tradename KBM-403, manufactured by Shin-Etsu Chemical Co., Ltd.)

DEGDM: diethylene glycol dimethyl ether

M325: methyl ether-modified melamine resin (tradename MYCOAT #325, manufactured by Mitsui Cytec Ltd.,)

CCR-1115: cresol novolac resin(tradename CCR-1115, manufactured by Nippon Kayaku Co., Ltd., number of ethylenic double bonds: about 6)

EOCN-104S: cresol novolac type epoxy resin (tradename EOCN-104S, manufactured by Nippon Kayaku Co., Ltd.)

F172: perfluoroalkyl group- and lipophiilc group-containing oligomer (tradename Megafac F172, manufactured by Dainippon Ink and Chemicals, Incorporated)

P-1M: $CH_2{=}C(CH_3)COOCH_2CH_2OPO(OH)_2$ (tradename Light Ester P-1M, manufactured by Kyoeisha Chemical Co., Ltd.)

P-2M: $(CH_2{=}C(CH_3)COOCH_2CH_2O)_2POOH$ (tradename Light Ester P-2M Kyoeisha Chemical Co., Ltd.)

PETMA: pentaerythritol tetramethacrylate

HPPMA: 2-hydroxy-3-phenyloxypropyl methacrylate

NVP: N-vinylpyrrolidone

CB: carbonblack (propylene glycol monomethyl ether acetate solution containing 20% of black pigment)

Preparation of Alkali-Soluble Photosensitive Resin (A)

Preparation Example 1

Into an autoclave having an internal capacity of 1 L and equipped with a stirrer, 555.0 g of acetone, 96.0 g of AA, 96.0 g of HEMA, 48.0 g of IBMA, 9.7 g of chain transfer agent DSH and 7.1 g of polymerization initiator V-70 were charged and polymerized at 40° C. for 18 hours with stirring in a nitrogen atmosphere to obtain a solution of polymer 1. The number average molecular weight of the polymer 1 was 5,000.

Water was added to an acetone solution of the obtained polymer 1 for reprecipitation and purification. Then, with petroleum ether, reprecipitation and purification were carried out, followed by vacuum drying to obtain 240 g of polymer 1.

Into a glass flask having an internal capacity of 300 mL and equipped with a thermometer, a stirrer and a heating device, 100 g of polymer 1, 48.3 g of MOI, 0.19 g of DBTDL, 2.4 g of BHT and 100 g of acetone were charged and polymerized at 30° C. for 18 hours with stirring, to obtain a solution of resin A-1. The number average molecular weight of the resin A-1 was 6,900.

Water was added to an acetone solution of the obtained resin A-1 for reprecipitation and purification. Then, with petroleum ether, reprecipitation and purification were carried out, followed by vacuum drying to obtain 148 g of resin A-1. Ethylenic double bonds contained per molecule were 12.3 bonds.

Preparation Example 2

Polymers 2 to 9 and 11 were obtained in the same manner as for the preparation of polymer 1 except that the blend amounts of the raw materials were changed as shown in Table 1.

Water was added to an acetone solution of the obtained polymer 2 for reprecipitation and purification. Then, with petroleum ether, reprecipitation and purification were carried out, followed by vacuum drying to obtain 240 g of polymer 2.

Into a glass flask having an internal capacity of 300 mL and equipped with a thermometer, a stirrer and a heating device, 100 g of polymer 2, 41.8 g of AC, 46.7 g of TEA and 100 g of acetone were charged and polymerized at 30° C. for 18 hours with stirring, to obtain a solution of resin A-2. The number average molecular weight of the resin A-2 was 6,860.

Water was added to an acetone solution of the obtained resin A-2 for reprecipitation and purification, followed by washing with a 1% hydrochloric acid aqueous solution. Then, with petroleum ether, reprecipitation and purification were carried out, followed by vacuum drying to obtain 140 g of resin A-2.

Preparation of Ink Repellent (B) and its Comparative Example

Preparation Example 3

Resin B-1 was obtained in the same manner as for the preparation of resin A-1 except that the blend amounts of the raw materials were changed as shown in Table 2.

Preparation Example 4

Resin B-2 was obtained in the same manner as for the preparation of resin A-2 except that the blend amounts of the raw materials were changed as shown in Table 2.

Preparation Example 5

Resin B-3 was obtained in the same manner as for the preparation of resin A-1 except that the blend amounts of the raw materials were changed as shown in Table 2.

Preparation Example 6

Into a glass flask having an internal capacity of 300 mL and equipped with a thermometer, a stirrer and a heating device, 100 g of polymer 5, 42.2 g of ECA and 100 g of MIBK were charged and polymerized at 50° C. for 48 hours with stirring, to obtain a solution of resin B-4. The number average molecular weight of the resin B-4 was 10,000.

Water was added to an acetone solution of the obtained resin B-4 for reprecipitation and purification. Then, with petroleum ether, reprecipitation and purification were carried out, followed by vacuum drying to obtain 140 g of resin B-4.

Preparation Example 7

Resin B-5 was obtained in the same manner as for the preparation of resin A-1 except that the blend amounts of the raw materials were changed as shown in Table 2.

Preparation Example 8

Resin B-6 was obtained in the same manner as for the preparation of resin A-1 except that the blend amounts of the raw materials were changed as shown in Table 2.

Preparation Example 9

Resin B-7 was obtained in the same manner as for the preparation of resin A-2 except that the blend amounts of the raw materials were changed as shown in Table 2.

Preparation Example 10

Resin B-8 was obtained in the same manner as for the preparation of resin A-1 except that the blend amounts of the raw materials were changed as shown in Table 2.

Preparation Example 11

Into an autoclave having an internal capacity of 0.3 L and equipped with a stirrer, 100.0 g of EEA, 40.0 g of GMA, 60.0 g of TFEMA and 3.0 g of polymerization initiator benzoyl peroxide were charged and polymerized at 75° C. for 5 hours with stirring in a nitrogen atmosphere, to obtain a 50% solution of polymer 10.

Then, into a glass flask having an internal capacity of 500 mL and equipped with a thermometer, a stirrer and a heating device, 300 g of the 50% solution of polymer 10, 26.9 g of AA, 0.16 g of methyl hydroquinone and 0.9 g of triphenyl phosphine were charged and polymerized at 95° C. for 32 hours, and further, 49.8 g of succinic anhydride and 79.4 g of EEA were additionally charged, followed by polymerization at 90° C. for 10 hours to obtain a solution of resin B-9. The number average molecular weight of the resin B-9 was 20,000.

Water was added to the EEA solution of the obtained resin B-9 for reprecipitation and purification. Then, with petroleum ether, reprecipitation and purification were carried out, followed by vacuum drying to obtain 220 g of resin B-9. The fluorine content of the resin B-9 was 11.5%.

Preparation Example 12

Resin B-10 was obtained in the same manner as for the preparation of resin A-1 except that the blend amounts of the raw materials were changed as shown in Table 2.

TABLE 1

| | Polymer | | | | | | | | | |
|---|---|---|---|---|---|---|---|---|---|---|
| | 1 | 2 | 3 | 4 | 5 | 6 | 7 | 8 | 9 | 11 |
| Blend amounts (g) | | | | | | | | | | |
| C6FMA | | | 96.0 | 96.0 | 144.0 | | | 96.0 | 96.0 | 96.0 |
| C4FMA | | | | | | 96.0 | | | | |
| C8FA | | | | | | | 96.0 | | | |
| AA | 96.0 | 48.0 | | | | | | | 48.0 | |
| MAA | | | 72.0 | 48.0 | 96.0 | 72.0 | 72.0 | 48.0 | | |
| HEMA | 96.0 | 144.0 | 72.0 | | | 72.0 | 72.0 | 48.0 | 48.0 | 96.0 |
| IBMA | 48.0 | | | 48.0 | | | | | | 48.0 |
| CHMA | | 48.0 | | | | | | | 48.0 | |
| MMA | | | | | | | | 48.0 | | |
| N-MAA | | | | 48.0 | | | | | | |
| Acetone | 555.0 | 555.0 | 555.0 | 555.0 | 555.0 | 555.0 | 555.0 | 555.0 | 555.0 | 555.0 |
| V-70 | 7.1 | 6.4 | 5.0 | 5.0 | 5.0 | 5.0 | 5.0 | 5.0 | 5.0 | 3.6 |
| DSH | 9.7 | 9.7 | 9.7 | 24.2 | 9.7 | 9.7 | 9.7 | 6.9 | 9.7 | 16.2 |
| Yield (g) | 240 | 240 | 240 | 240 | 240 | 240 | 240 | 240 | 240 | 240 |
| Molecular weight | 5,000 | 5,000 | 5,000 | 2,000 | 5,000 | 5,000 | 5,000 | 7,000 | 5,000 | 2,900 |

TABLE 2

| | Preparation Example | | | | | | | | | | |
|---|---|---|---|---|---|---|---|---|---|---|---|
| | 1 | 2 | 3 | 4 | 5 | 6 | 7 | 8 | 9 | 10 | 12 |
| | Resin | | | | | | | | | | |
| | A-1 | A-2 | B-1 | B-2 | B-3 | B-4 | B-5 | B-6 | B-7 | B-8 | B-10 |
| Blend amounts (g) | | | | | | | | | | | |
| | Polymer 1: 100 | Polymer 2: 100 | Polymer 3: 100 | Polymer 3: 100 | Polymer 4: 100 | Polymer 5: 100 | Polymer 6: 100 | Polymer 7: 100 | Polymer 8: 100 | Polymer 9: 100 | Polymer 11: 100 |
| MOI | 48.3 | | 36.2 | | 30.7 | | 35.8 | 35.8 | | 23.8 | 47.7 |
| DBTDL | 0.19 | | 0.15 | | 0.12 | | 0.14 | 0.14 | | 0.10 | 0.19 |

TABLE 2-continued

| | Preparation Example | | | | | | | | | | |
|---|---|---|---|---|---|---|---|---|---|---|---|
| | 1 | 2 | 3 | 4 | 5 | 6 | 7 | 8 | 9 | 10 | 12 |
| | Resin | | | | | | | | | | |
| | A-1 | A-2 | B-1 | B-2 | B-3 | B-4 | B-5 | B-6 | B-7 | B-8 | B-10 |
| BHT | 2.4 | | 1.8 | | 1.5 | | 1.8 | 1.8 | | 1.2 | 2.4 |
| AC | | 41.8 | | 20.9 | | | | | 13.9 | | |
| TEA | | 46.7 | | 23.4 | | | | | 15.6 | | |
| ECA | | | | | | 42.4 | | | | | |
| Acetone | 100 | 100 | 100 | 100 | 100 | | 100 | 100 | 100 | 100 | 100 |
| MIBK | | | | | | 100 | | | | | |
| Yield (g) | 148 | 140 | 135 | 112 | 130 | 140 | 132 | 134 | 110 | 121 | 145 |
| Molecular weight | 6,900 | 6,860 | 7,000 | 6,200 | 3,000 | 10,000 | 7,000 | 7,000 | 8,100 | 6,400 | 4,500 |
| Acid value (mgKOH/g) | 229 | 115 | 139 | 158 | 87 | 72 | 140 | 138 | 113 | 102 | 0 |
| Number of C = C per molecule | 12.3 | 20.6 | 13.2 | 13.2 | 6.4 | 13.4 | 12.7 | 13.5 | 12.2 | 9.1 | 14.4 |
| Fluorine content (%) | | | 16.2 | 18.5 | 15.3 | 18.9 | 14.8 | 17.6 | 19.8 | 17.8 | 13.1 |

Evaluation of Negative Photosensitive Resin Composition

In the proportions as shown in Tables 3 and 4, resins A-1 and A-2, resins B-1 to B-10, photopolymerization initiators (C), radical crosslinking agent (D), silane coupling agent (E), diluting agent (F), thermosetting agent (G) and, as the case requires, other components, were blended to obtain negative photosensitive resin compositions of Examples 1 to 17.

Then, each negative photosensitive resin composition was applied onto a glass substrate by a spinner and then prebaked at 100° C. for two minutes on a hotplate to form a coating film having a thickness of 3.0 μm.

Then, a mask (line/space=20 μm/20 μm) was contacted to the coating film, followed by irradiation with 150 mJ/cm$^2$ by an ultrahigh pressure mercury lamp. Then, a non-exposed portion was dipped in a 0.1 wt % tetramethylammonium hydroxide aqueous solution for 40 seconds for development, and the non-exposed portion was washed off with water, followed by drying. Then, heating was carried out at 220° C. for one hour on a hotplate to obtain a glass substrate having a pattern formed thereon.

With respect to the glass substrate having a pattern formed thereon, evaluation of the ink repellency, the durability of the ink repellency and the developability was carried out by the following methods. The results are summarized in Tables 3 and 4.

Ink repellency: The contact angles of water and xylene at the resin portion of the pattern formed on the glass substrate, were measured.

Durability of the ink repellency: While the glass substrate having a pattern formed, was transported on a sample table at a constant speed of 5 mm/sec, a fan-shaped thin layer of water jet was applied to the sample by using an ultrahigh pressure jet precision washing system AF 5400S (manufactured by Asahi Sunac Corporation) as a high pressure jetting apparatus. The ultrahigh pressure microjet had the fan-shaped jetting plane at a right angle to the advancing direction of the sample and jetted in a direction perpendicular to the sample surface. The applied pressure of the ultrahigh pressure microjet at that time was adjusted to be 150 kgf/cm$^2$ (14.7 MPa). After washing with water, the contact angles of water and xylene at the resin portion of the pattern formed on the glass substrate were measured.

Developability: Symbol ○ indicates a case where the development was successful, symbol Δ indicates a case where a pattern of line/space was formed, but the line portion of the line/space was partially broken, curved or folded, and symbol X indicates a case where a pattern of line/space was not formed.

Adhesion to the substrate: The adhesion was evaluated by the cross-cut tape method as disclosed in JIS K5400. The coating film was cross-cut by a cutter in a distance of 2 mm to have 25 sections. Then, an adhesive tape was bonded and peeled, whereupon the adhesion state of the coating film was visually evaluated. Symbol X indicates a case where almost all sections were peeled, and symbol ○ indicates that no sections were peeled.

TABLE 3

| | [Blend] | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|
| (A) | A-1 | 100 | | 100 | 100 | 100 | 100 | 100 | 100 | |
| | A-2 | | 100 | | | | | | | |
| | CCR-1115 | | | | | | | | | 100 |
| (B) | | B-1 | B-2 | B-3 | B-4 | B-5 | B-6 | B-7 | B-8 | B-1 |
| | | 10 | 10 | 1.0 | 30 | 10 | 10 | 10 | 10 | 10 |
| (C) | IR907 | 1.0 | 1.0 | 1.0 | 1.0 | 1.0 | 1.0 | 1.0 | 1.0 | 1.0 |
| | DEAB | 1.0 | 1.0 | 1.0 | 1.0 | 1.0 | 1.0 | 1.0 | 1.0 | 1.0 |
| (D) | D310 | 100 | 100 | 100 | 100 | 100 | 100 | 100 | 100 | 100 |
| (E) | KBM403 | 0.5 | 0.5 | 0.5 | 0.5 | 0.5 | 0.5 | 0.5 | 0.5 | 0.5 |
| (F) | DEGDM | 300 | 300 | 300 | 300 | 300 | 300 | 300 | 300 | 300 |
| (G) | M325 | 1.0 | 1.0 | 1.0 | 1.0 | 1.0 | 1.0 | 1.0 | 1.0 | 1.0 |

TABLE 3-continued

| [Blend] | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|
| Proportion of ink repellent (%) | 4.7 | 4.7 | 0.5 | 12.8 | 4.7 | 4.7 | 4.7 | 4.7 | 4.7 |
| [Evaluation results of coating films] | | | | | | | | | |
| Contact angle of water (°) | 110 | 107 | 105 | 110 | 110 | 105 | 102 | 102 | 106 |
| Contact angle of xylene (°) | 55 | 52 | 52 | 55 | 57 | 51 | 53 | 55 | 53 |
| Contact angle of water after washing with water (°) | 106 | 105 | 103 | 108 | 107 | 103 | 100 | 100 | 103 |
| Contact angle of xylene after washing with water (°) | 53 | 49 | 48 | 54 | 54 | 50 | 50 | 50 | 50 |
| Developability | ○ | ○ | ○ | ○ | ○ | ○ | ○ | ○ | ○ |
| Adhesion to substrate | ○ | ○ | ○ | ○ | ○ | ○ | ○ | ○ | ○ |

TABLE 4

| [Blend] | Ex. 10 | Ex. 11 | Ex. 12 | Ex. 13 | Ex. 14 | Ex. 15 | Ex. 16 | Ex. 17 |
|---|---|---|---|---|---|---|---|---|
| (A) A-1 | | | 100 | 100 | 100 | | 100 | 100 |
| A-2 | | | | | | | | |
| | | | | | | P-1M: 50<br>P-2M: 100 | | |
| (B) | B-1 | B-9 | | F172 | B-1 | B-1 | B-1 | B-10 |
| | 100 | 100 | | 1.0 | 300 | 10 | 10 | 4.0 |
| (C) IR907 | 1.0 | 1.0 | 1.0 | 1.0 | 4.0 | 1.0 | 20 | 20 |
| DEAB | 1.0 | 1.0 | 1.0 | 1.0 | 4.0 | 1.0 | 10 | 10 |
| (D) D310 | 100 | 100 | 100 | 100 | 400 | PETMA: 50 | 100 | 100 |
| (E) KBM403 | 0.5 | 0.5 | 0.5 | 0.5 | 2.0 | 0.5 | 10 | 10 |
| (F) DEGDM | 300 | 300 | 300 | 300 | 1200 | HPPMA: 50 | 140 | 140 |
| | | | | | | NVP: 50 | | |
| (G) M325 | 1.0 | 1.0 | 1.0 | 1.0 | 4.0 | 1.0 | 1.0 | 1.0 |
| EOCN-104S | | 20 | | | | | | |
| Other components | | | | | | | CB: 200 | |
| Proportion of ink repellent (%) | 49.1 | 44.7 | 0 | 0.5 | 36.9 | 4.7 | 3.4 | 1.6 |
| [Evaluation results of coating films] | | | | | | | | |
| Contact angle of water (°) | 110 | 81 | 75 | 103 | 109 | 99 | 105 | 110 |
| Contact angle of xylene (°) | 58 | 28 | 10 or less | 52 | 54 | 45 | 53 | 55 |
| Contact angle of water after washing with water (°) | 108 | 80 | 69 | 94 | 108 | 97 | 104 | 109 |
| Contact angle of xylene after washing with water (°) | 56 | 27 | 10 or less | 28 | 54 | 43 | 51 | 54 |
| Developability | Δ | x | ○ | ○ | Δ | x | ○ | ○ |
| Adhesion to substrate | x | x | ○ | ○ | x | ○ | ○ | ○ |

INDUSTRIAL APPLICABILITY

According to the present invention, it is possible to present a negative photosensitive resin composition which is excellent in adhesion to a glass substrate, etc. and has high ink repellency and its durability, whereby even when subjected to e.g. a washing step as a post treating step, the ink repellency will not decrease, and which further has excellent alkali solubility and developability. Thus, the negative photosensitive resin composition of the present invention is useful e.g. for the production of barrier ribs for e.g. organic EL displays or color filters for liquid crystal for an ink jet system, where adhesion to a substrate or ink repellency is required, or for the production of wiring patterns in electric circuits or in semiconductor devices.

The entire disclosure of Japanese Patent Application No. 2002-322215 filed on Nov. 6, 2002 including specification, claims and summary is incorporated herein by reference in its entirety.

What is claimed is:

1. A negative photosensitive resin composition comprising an alkali-soluble photosensitive resin (A) having acidic groups and having at least three ethylenic double bonds per molecule, an ink repellent (B) made of a polymer having polymerized units (b1) having a $C_{20}$ or lower alkyl group in which at least one of its hydrogen atoms is substituted by a fluorine atom (provided that the alkyl group may contain etheric oxygen), and polymerized units (b2) having an ethylenic double bond, and a photopolymerization initiator (C), wherein the ink repellent (B) has a number average molecular weight that is at least 1,000 and less than 15,000, the fluorine content in the ink repellent (B) is from 5 to 25 mass %, and the proportion of the ink repellent (B) is from 0.01 to 20 mass %, based on the total solid content of the negative photosensitive resin composition.

2. The negative photosensitive resin composition according to claim 1, which contains, based on 100 parts by mass of the photosensitive resin (A), from 0.1 to 200 parts by mass of the ink repellent (B) and from 0.1 to 50 parts by mass of the photopolymerization initiator (C).

3. The negative photosensitive resin composition according to claim 1, wherein the ink repellent (B) has acidic groups.

4. The negative photosensitive resin composition according to claim 1, which contains, based on 100 parts by mass of the photosensitive resin (A), from 10 to 500 parts by mass of a radical crosslinking agent (D) made of an alkali-insoluble compound having at least two ethylenic double bonds.

5. The negative photosensitive resin composition according to claim 1, which contains at least one member selected from the group consisting of carbon black, black titanium oxide, a black metal oxide pigment and an organic pigment.

6. The negative photosensitive resin composition according to claim 1, wherein the ink repellent (B) has a number average molecular weight that is at least 1000 and less than 10,000.

7. A method of making a negative photosensitive resin composition, the method comprising blending together an alkali-soluble photosensitive resin (A), an ink repellent (B), a photopolymerization initiator (C); and producing the resin composition of claim 1.

8. The negative photosensitive resin composition according to claim 1, wherein the ink repellent (B) has a number average molecular weight that is at least 3,000 and less than 15,000.

9. The negative photosensitive resin composition according to claim 1, further comprising a silane coupling agent (E).

* * * * *